United States Patent
Li et al.

(10) Patent No.: US 9,201,473 B2
(45) Date of Patent: Dec. 1, 2015

(54) PUSH BUTTON ASSEMBLY, CHASSIS, AND OPERATING METHOD OF CHASSIS

(71) Applicant: WISTRON CORP., New Taipei (TW)

(72) Inventors: Qi-Qiong Li, New Taipei (TW); Yong-Liang Zheng, New Taipei (TW)

(73) Assignee: WISTRON CORP., New Taipei (TW)

( * ) Notice: Subject to any disclaimer, the term of this patent is extended or adjusted under 35 U.S.C. 154(b) by 85 days.

(21) Appl. No.: 14/215,087

(22) Filed: Mar. 17, 2014

(65) Prior Publication Data

US 2015/0092339 A1   Apr. 2, 2015

(30) Foreign Application Priority Data

Sep. 29, 2013 (CN) .......................... 2013 1 0456343

(51) Int. Cl.
*G06F 1/18* (2006.01)
*E05B 65/00* (2006.01)
*H05K 7/14* (2006.01)
*H05K 5/02* (2006.01)

(52) U.S. Cl.
CPC .............. *G06F 1/187* (2013.01); *E05B 65/006* (2013.01); *H05K 5/0221* (2013.01); *H05K 7/1409* (2013.01); *Y10T 74/20006* (2015.01); *Y10T 292/432* (2015.04)

(58) Field of Classification Search
CPC ..... G06F 1/1658; G06F 1/187; G06F 1/1616; F16B 2/02; E05B 65/006; H05K 7/1409; H05K 5/0221; Y10T 292/1015; Y10T 292/432
USPC ........ 361/679.37–679.39, 725–727, 754, 798
See application file for complete search history.

(56) References Cited

U.S. PATENT DOCUMENTS

| 5,317,483 A | 5/1994 | Swindler |
| 5,446,618 A * | 8/1995 | Tetsuya et al. ........... 361/679.37 |
| 5,823,644 A * | 10/1998 | Suh et al. ................... 312/223.2 |
| 6,824,174 B2 * | 11/2004 | Lin et al. ......................... 292/85 |
| 7,035,098 B2 * | 4/2006 | Huang et al. ............. 361/679.33 |
| 7,201,407 B2 * | 4/2007 | Schlack ........................ 292/139 |
| 7,325,846 B2 * | 2/2008 | Smith et al. ................ 292/336.3 |

(Continued)

FOREIGN PATENT DOCUMENTS

TW    M395855 U    1/2011

OTHER PUBLICATIONS

The office action of the corresponding Taiwanese application issued on Jul. 13, 2015 and its partial English translation.

*Primary Examiner* — Adrian S Wilson
*Assistant Examiner* — Abhishek Rathod
(74) *Attorney, Agent, or Firm* — CKC & Partners Co., Ltd.

(57) ABSTRACT

A push button assembly disposed on a cover has a push button hole, and includes a holder, a latch, a resilient member, and pushing bracket. The holder forms a chute with the cover. The holder has an abutting plate and a retaining structure. The abutting plate and the retaining structure are respectively located at first and second ends of the chute. The latch is slidably disposed in the chute and faces the push button hole. The retaining structure can prevent the latch from leaving the chute from the second end. The resilient member is disposed in the chute and compressed between the abutting plate and the latch. The pushing bracket is connected to the latch and extends away from the cover. The disclosure further discloses a chassis applying the push button assembly and an operating method of the chassis.

12 Claims, 9 Drawing Sheets

(56) References Cited

U.S. PATENT DOCUMENTS

| | | | |
|---|---|---|---|
| 7,715,184 B2* | 5/2010 | Yang | 361/679.37 |
| 8,270,173 B2* | 9/2012 | Chang | H05K 5/0221 |
| | | | 361/679.01 |
| 8,508,929 B2* | 8/2013 | Anguiano-Wehde et al. | 361/679.33 |
| 2002/0182896 A1* | 12/2002 | Welsh | H05K 7/1409 |
| | | | 439/1 |
| 2006/0103141 A1* | 5/2006 | Schlack | E05C 1/065 |
| | | | 292/139 |
| 2011/0037358 A1* | 2/2011 | Lung | G06F 1/187 |
| | | | 312/223.2 |
| 2011/0157779 A1* | 6/2011 | Chang et al. | 361/679.01 |
| 2012/0170226 A1* | 7/2012 | Chen et al. | 361/726 |
| 2014/0013811 A1* | 1/2014 | Yang | 70/163 |

* cited by examiner

Fig. 6

PUSH BUTTON ASSEMBLY, CHASSIS, AND OPERATING METHOD OF CHASSIS

RELATED APPLICATIONS

This application claims priority to Chinese Application Serial Number 201310456343.4, filed Sep. 29, 2013, which is herein incorporated by reference.

BACKGROUND

1. Technical Field

The present disclosure relates to a push button assembly, a chassis, and an operating method of chassis.

2. Description of Related Art

Hot-swappable devices in an industrial computer (e.g., a server) generally include a hot-swappable power source, a hot-swappable hard drive, a hot-swappable battery, and a hot-swappable fan. The hot-swappable devices are generally installed on a panel or a backplate of the industrial computer and can be replaced directly from the panel or backplate. The so-called hot swapping refers to an action of physically connecting or removing a peripheral to or from a computer system without turning off the power of the computer system. The hot-swap capability is especially important on a chassis-level system for allowing the system (computer) to expand its capability without service interruption.

Nowadays, most of the storage devices (e.g., hard drives, CD-ROM drives, etc.) in an industrial computer are fastened to a tray, and then the tray slides into and fixed on slide of a chassis of the industrial computer. The storage devices can be taken out of the chassis by pulling out the tray. However, a conventional tray generally has a standard size and will occupy a lot of internal space of the chassis after sliding into the chassis. Hence, the conventional approach of placing the storage devices into the chassis by using the tray is disadvantageous to miniaturization of the chassis.

Accordingly, how to provide a chassis conveniently dismantled the storage devices therein without occupying a lot of the internal space therein becomes an important issue to be solved by those in the industry.

SUMMARY

The disclosure provides a push button assembly. The push button assembly is disposed on a cover. The cover has a push button hole. The push button assembly includes a holder, a latch, a resilient member, and a pushing bracket. The holder is fixed to the cover and forms a chute with the cover. The holder has an abutting plate and a retaining structure. The chute has a first end and a second end. The abutting plate is located at the first end, and the retaining structure is located in the chute. The latch is slidably disposed in the chute and aligned with the push button hole. The retaining structure blocks the latch, so as to prevent the latch from escaping the chute from the second end. The resilient member is disposed in the chute and compressed between the abutting plate and the latch. The pushing bracket is connected to the latch and substantially extends away from the cover.

In an embodiment of the disclosure, the chute is parallel to a sliding direction. The retaining structure is a slotted hole. The slotted hole extends along the sliding direction. The latch has a resilient arm. A distal end of the resilient arm is slidably engaged with the slotted hole.

In an embodiment of the disclosure, the resilient member is a spring. The abutting plate has a through hole. The latch further has a column. The column extends toward the first end and passes through the through hole. The spring is sleeved onto the column.

In an embodiment of the disclosure, the holder further has a passing hole. The pushing bracket includes a passing portion and a pushing portion. The passing portion is connected to the latch and passes through the passing hole. The pushing portion is connected to the passing portion and substantially parallel to the sliding direction.

The disclosure further provides a chassis for accommodating a storage device. The chassis includes a base, a cover, a partition, an engaging bracket, and a push button assembly. The storage device is slidably disposed on the base along a sliding direction. The cover is connected to the base to form an entrance and an accommodating space. The partition is disposed on the base and is adjacent to a sidewall of the storage device. The partition includes a stopping portion. The stopping portion is located over a top surface of the storage device. The engaging bracket is fixed to the sidewall and includes a bent portion. The bent portion is located over the storage device, faces toward the entrance, and is bent upwards relative to the storage device. The stopping portion blocks between a distal end of the bent portion and the entrance. The push button assembly is fixed on the cover and includes a pushing bracket. The pushing bracket substantially extends away from the cover and is capable of sliding relative to the cover along the sliding direction. When the pushing bracket slides toward the entrance to push the bent portion, the bent portion is deformed toward the storage device to escape from the blocking of the stopping portion.

In an embodiment of the disclosure, a distal end of the pushing portion faces toward the bent portion.

In an embodiment of the disclosure, the engaging bracket further includes at least one engaging portion. The engaging portion is engaged with an engaging hole on the sidewall of the storage device.

In an embodiment of the disclosure, the engaging bracket further includes a bracket body. The bracket body is clamped between the sidewall and the partition, and is connected to the bent portion and the engaging portion.

In an embodiment of the disclosure, the bracket body includes a first body portion and a second body portion. The first body portion and the second body portion are connected to each other and bent relative to each other to form a folding line. The folding line abuts against the partition.

The disclosure further provides an operating method of a chassis for dismantling a storage device. The operating method includes: (a) providing a chassis, in which the chassis includes a base, a cover, a partition, an engaging bracket, and a pushing button assembly, the base and the cover are connected to form an entrance and an accommodating space, the storage device is slidably disposed on the base along a sliding direction, the partition is disposed on the base and adjacent to a sidewall of the storage device, the partition includes a stopping portion, the stopping portion is located over a top surface of the storage device, the engaging bracket is fixed to the sidewall and includes a bent portion, the bent portion is located over the storage device, faces toward the entrance, and upwardly bended relative to the storage device, the stopping portion blocks between the distal end of the bent portion and the entrance, the push button assembly is fixed on the cover and includes a pushing bracket, the pushing bracket substantially extends away from the cover and is capable of sliding relative to the cover along the sliding direction; (b) moving the pushing bracket toward the entrance along the sliding direction to push the bent portion, so as to deform the bent portion toward the storage device to escape from the blocking of the stopping portion; and (c) moving the storage device toward the entrance to leave the chassis.

Accordingly, the chassis of the disclosure uses the collocation of the partition and the engaging bracket that is engaged to the sidewall of the storage device cooperate to replace the conventional tray that supports the storage device, so as to effectively increase the internal space of the chassis. In addition, the push button assembly of the disclosure is disposed on the cover of the chassis, and the latch of the push button assembly is exposed from the push button hole of the cover, so that a user may push the latch from the exterior of the chassis to enable the pushing bracket to push the bent portion of the engaging bracket, thus removing the blocking of the stopping portion applied to the bent portion. Therefore, the user may easily remove the storage device from the chassis. The push button assembly of the disclosure is easy to be operated, and has a simple structure, and thus is cheap and affordable.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1A:
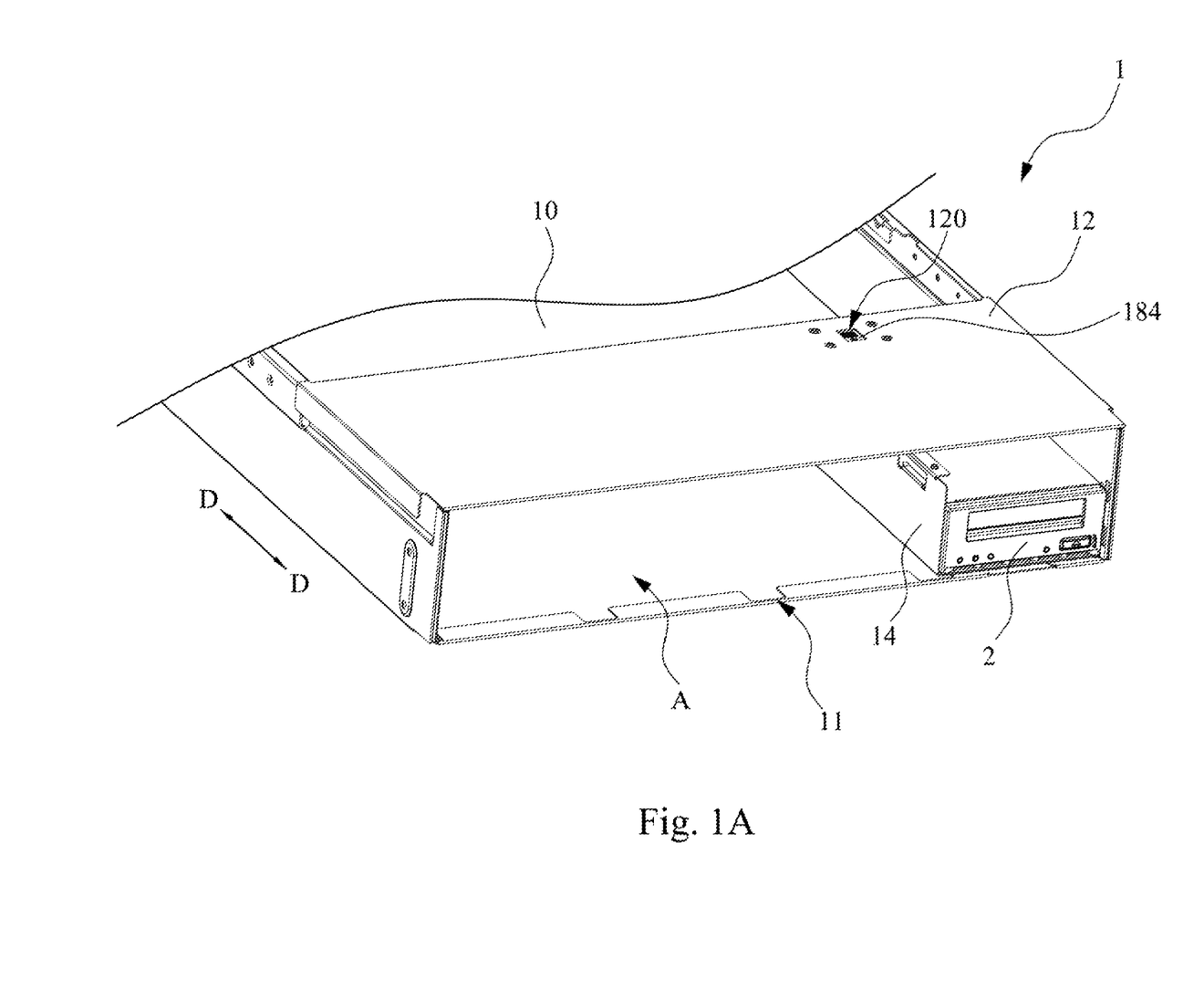
FIG. 1A is a partial perspective view of a chassis and a storage device according to an embodiment of this disclosure.
Figure 1B:
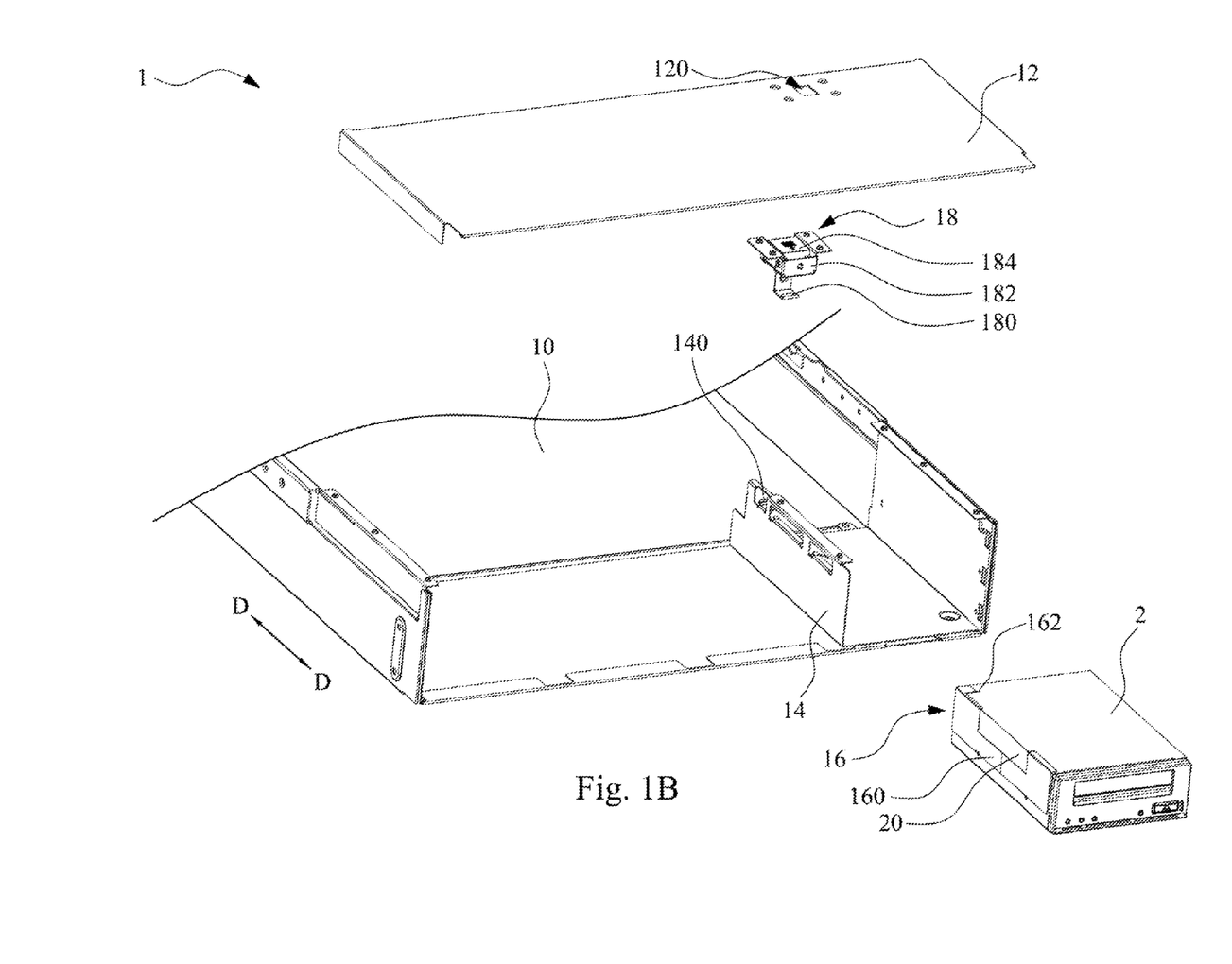
FIG. 1B is an exploded view of FIG. 1A.

FIG. 1A is a partial perspective view of a chassis 1 and a storage device 2 according to an embodiment of this disclosure. FIG. 1B is an exploded view of FIG. 1A.

As shown in FIG. 1A and FIG. 1B the chassis 1 is used to accommodate the storage device 2. The chassis 1 is a housing of a computer system (e.g., a server), and the storage device 2 is a CD-ROM drive, but the disclosure is note limited in this regard. The chassis 1 includes a base 10, a cover 12, a partition 14, an engaging bracket 16, and a push button assembly 18. The storage device 2 is slidably disposed on the base 10 along a sliding direction D. The cover 12 of the chassis 1 is connected to the base 10, so as to form an entrance 11 and an accommodating space A. The partition 14 of the chassis 1 is perpendicularly disposed on the base 10 and adjacent to a sidewall 20 of the storage device 2. The partition 14 includes a stopping portion 140. The stopping portion 140 of the partition 14 is located over the top surface of the storage device 2. The engaging bracket 16 of the chassis 1 is fixed to the sidewall 20 of the storage device 2 and includes a bent portion 162. The bent portion 162 of the engaging bracket 16 is located over the storage device 2, faces toward the entrance 11 of the chassis 1, and bent upwards relative to the storage device 2. The stopping portion 140 of the partition 14 blocks between a distal end of the bent portion 162 of the engaging bracket 16 and the entrance 11 of the chassis 1 (i.e., the stopping portion 140 is located between the distal end of the bent portion 162 and the entrance 11 in the sliding direction D). The push button assembly 18 of the chassis 1 is fixed on the cover 12 and includes a pushing bracket 180. The pushing bracket 180 of the push button assembly 18 substantially extends away from the cover 12 and is capable of sliding relative to the cover 12 along the sliding direction D. When the pushing bracket 180 of the push button assembly 18 slides toward the entrance 11 of the chassis 1 to push the bent portion 162 of the engaging bracket 16, the bent portion 162 is deformed toward the storage device 2 to escape from the blocking of the stopping portion 140. Hence, a user may take the storage device 2 out of the chassis 1 (by pushing or pulling) from the entrance 1

Figure 2A:
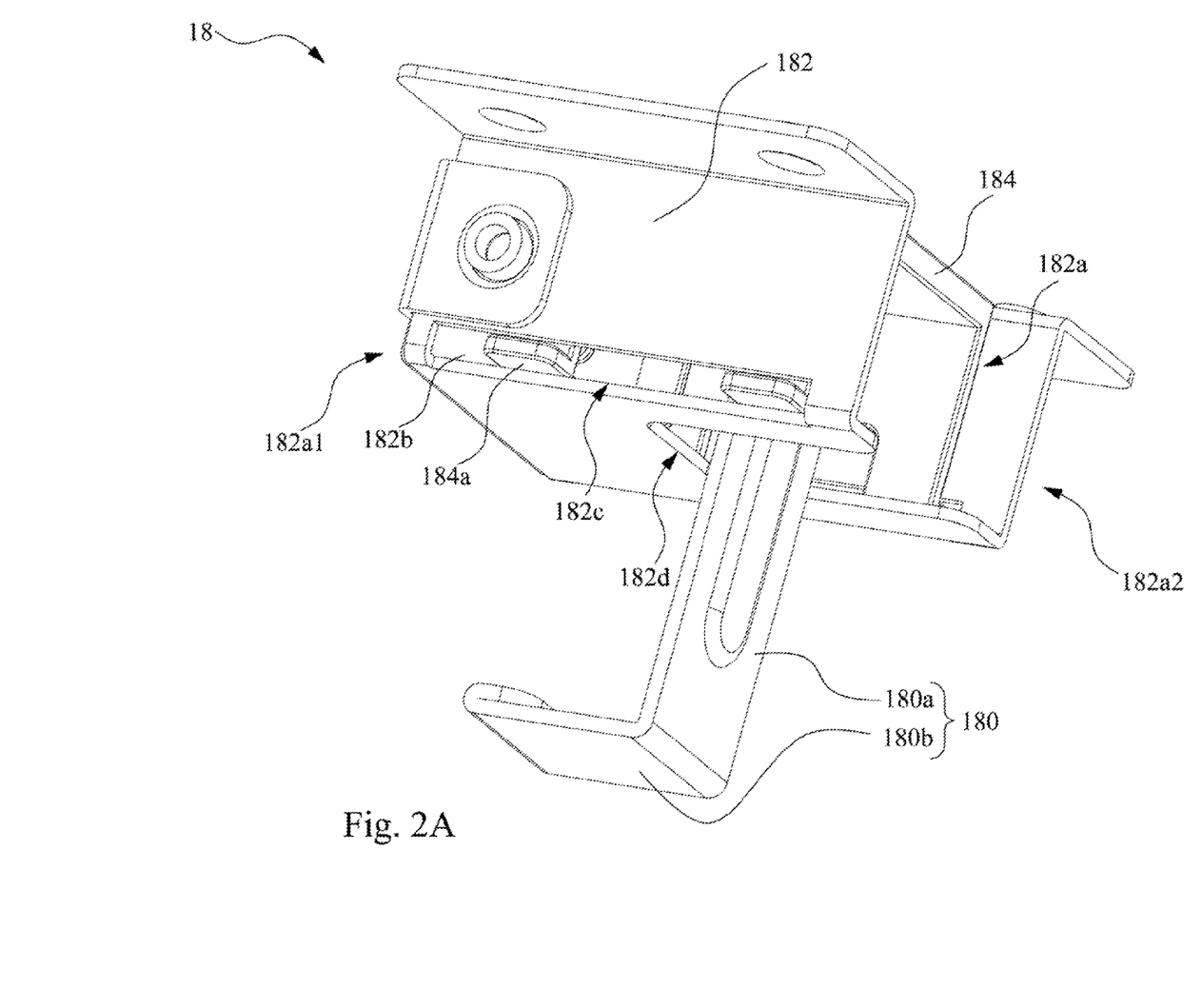
FIG. 2A is a perspective view of a push button assembly in FIG. 1B.
Figure 2B:
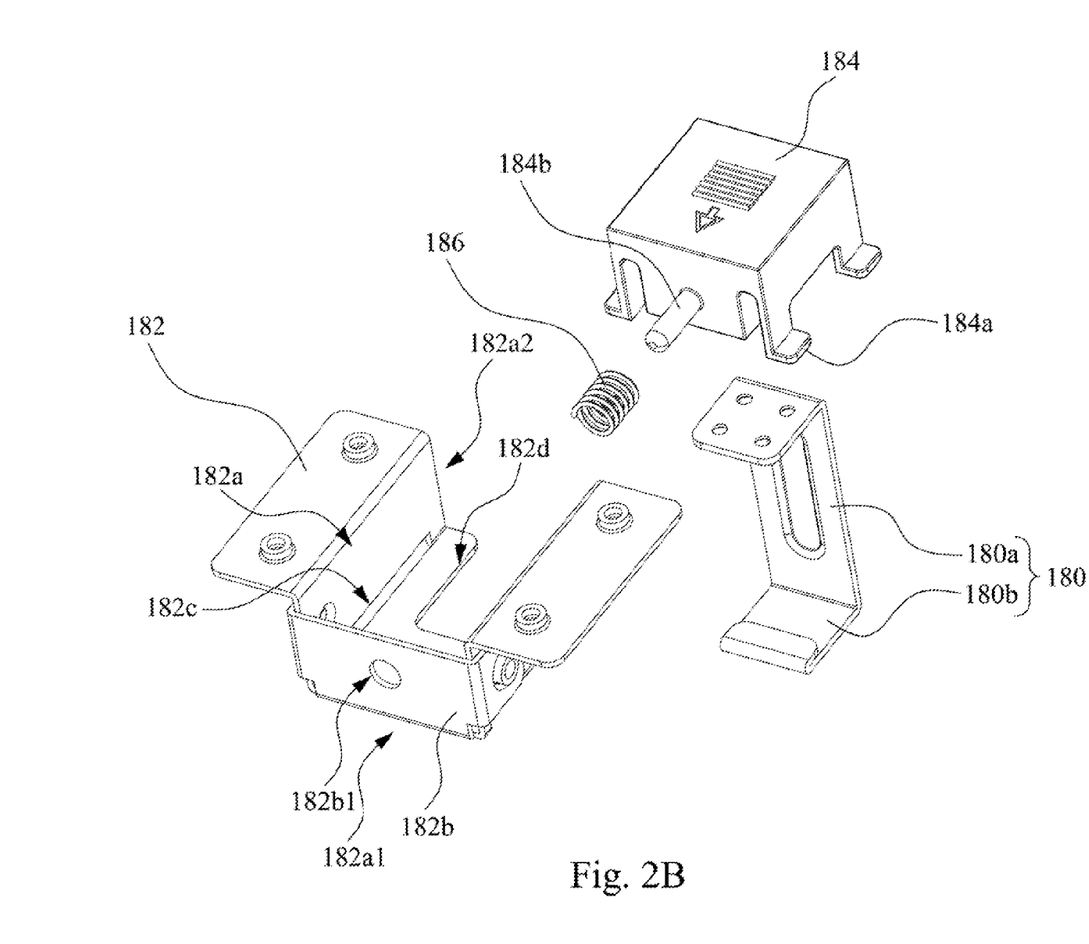
FIG. 2B is an exploded view of the push button assembly in FIG. 2A.

FIG. 2A is a perspective view of the push button assembly 18 in FIG. 1B. FIG. 2B is an exploded view of the push button assembly 18 in FIG. 2A.

As shown in FIG. 2A and FIG. 2B, the push button assembly 18 further includes a holder 182, a latch 184, and a resilient member (such as a spring 186). The holder 182 of the push button assembly 18 is fixed to the cover 12 and forms a chute 182*a* with the cover 12 (i.e. the appearance of the holder 182 is like a lid covering a portion of the bottom of the cover 12 upwards). The chute 182*a* is parallel to the sliding direction D. The holder 182 has an abutting plate 182*b* and a retaining structure (such as a slotted hole 182*c*). The chute 182*a* has a first end 182*a*1 and a second end 182*a*2. The first end 182*a*1 of the chute 182*a* faces toward the entrance 11 of the chassis 1. The abutting plate 182*b* of the holder 182 is located at the first end 182*a*1 of the chute 182*a*, and the retaining structure of the holder 182 is located in the chute 182*a*. The latch 184 of the push button assembly 18 is slidably disposed in the chute 182*a*. The retaining structure of the holder 182 blocks the latch 184, so as to prevent the latch 184 from leaving the chute 182*a* from the second end 182*a*2 of the chute 182*a*. The pushing bracket 180 of the push button assembly 18 is connected to the latch 184. The resilient member of the push button assembly 18 is disposed in the chute 182*a*, and is compressed between the abutting plate 182*b* of the holder 182 and the latch 184. Therefore, when the latch 184 is pushed toward the abutting plate 182*b* (i.e., the first end 182*a*1 of the chute 182*a*) of the holder 182 along the sliding direction D, the latch 184 compresses the resilient member and enables the pushing bracket 180 to slide. Afterwards, when the latch 184 is released, the resilient member is recovered to push the latch 184 to slide toward the second end 182*a*2 of the chute 182*a* along the sliding direction D together with the pushing bracket 180.

Furthermore, the retaining structure of the holder 182 is a slotted hole 182*c*. The slotted hole 182*c* extends along the sliding direction (i.e., the major axis of the slotted hole 182*c* is parallel to the sliding direction D). The latch 184 of the push button assembly 18 has a resilient arm 184*a*. A distal end of the resilient arm 184*a* is slidably engaged with the slotted hole 182*c*. During assembling, the resilient arm 184*a* can be pressed to be inwardly deformed. After the latch 184 is placed in the chute 182a and the resilient arm 184a is aligned with the slotted hole 182c, the resilient arm 184a can be released to be recovered and engaged with the slotted hole 182c. Hence, the slotted hole 182c of the holder 182 can surely guide the resilient arm 184a and make the latch 184 slide relative to the holder 182 along the sliding direction D.

In addition, the resilient member of the push button assembly 18 is a spring 186. The abutting plate 182b of the holder 182 has a through hole 182b1. The latch 184 of the push button assembly 18 further has a column 184b. The column 184b of the latch 184 extends toward the first end 182a1 of the chute 182a and passes through the through hole 182b1 of the abutting plate 182b. The spring 186 is sleeved onto the column 184b of the latch 184. Hence, during the period that the latch 184 slides relative to the holder 182, the column 184b of the latch 184 provides the function of positioning the spring 186.

Moreover, the holder 182 further has a passing hole 182d. The passing hole 182d of the holder 182 substantially faces the cover 12, and the chute 182a is located between the cover 12 and the passing hole 182d. The pushing bracket 180 includes a passing portion 180a and a pushing portion 180b. The passing portion 180a of the pushing bracket 180 is connected to the latch 184, passes through the passing hole 182d of the holder 182, and substantially extends away from the cover 12. The pushing portion 180b of the pushing bracket 180 is connected to the passing portion 180a and substantially parallel to the sliding direction D. In addition, a distal end of the pushing portion 180b faces toward the bent portion 162 of the engaging bracket 16 (i.e., a distal end of the pushing portion 180b and the bent portion 162 of the engaging bracket 16 are aligned with each other in the sliding direction D).

Figure 3:
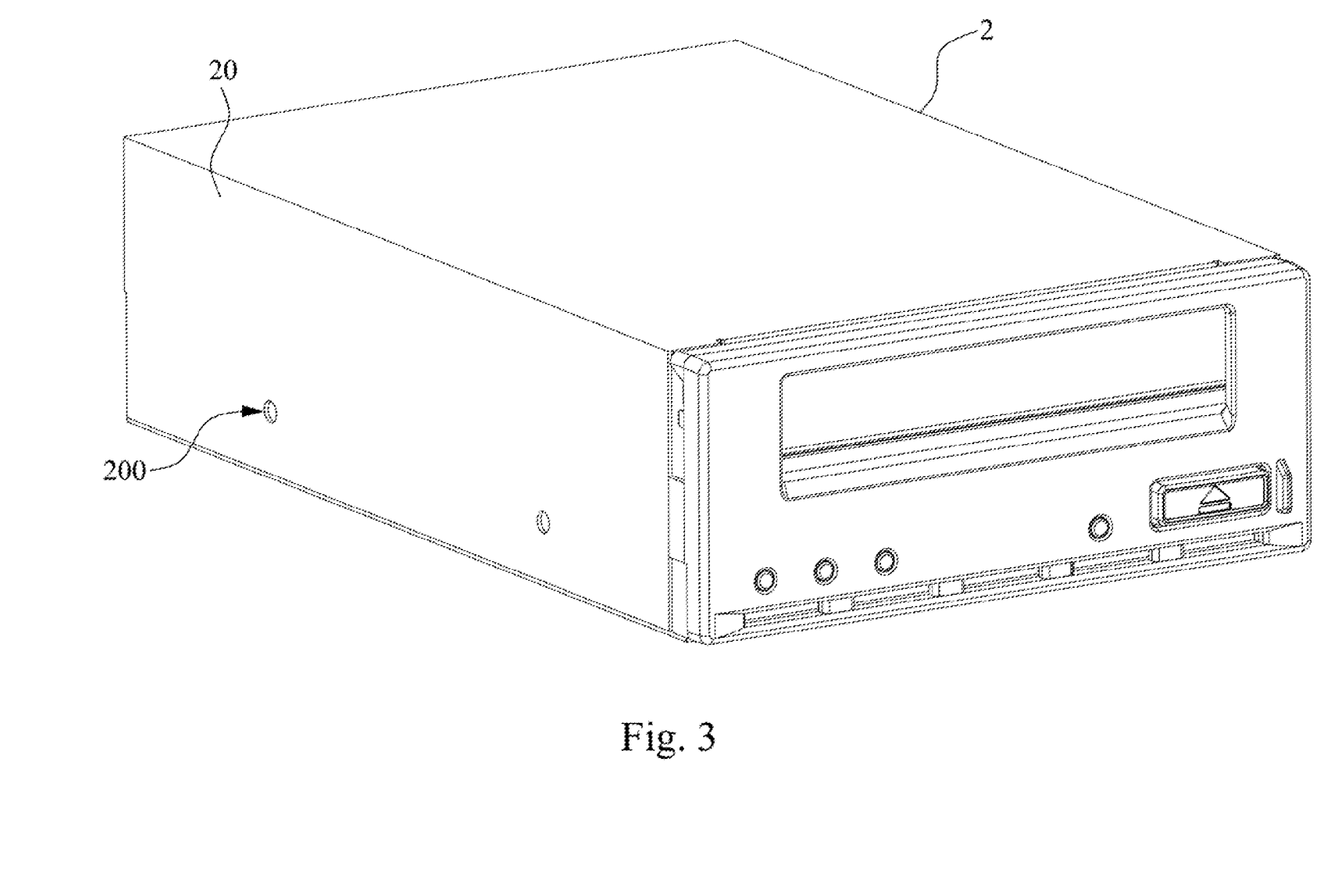
FIG. 3 is a perspective view of the storage device in FIG. 1B.
Figure 4:
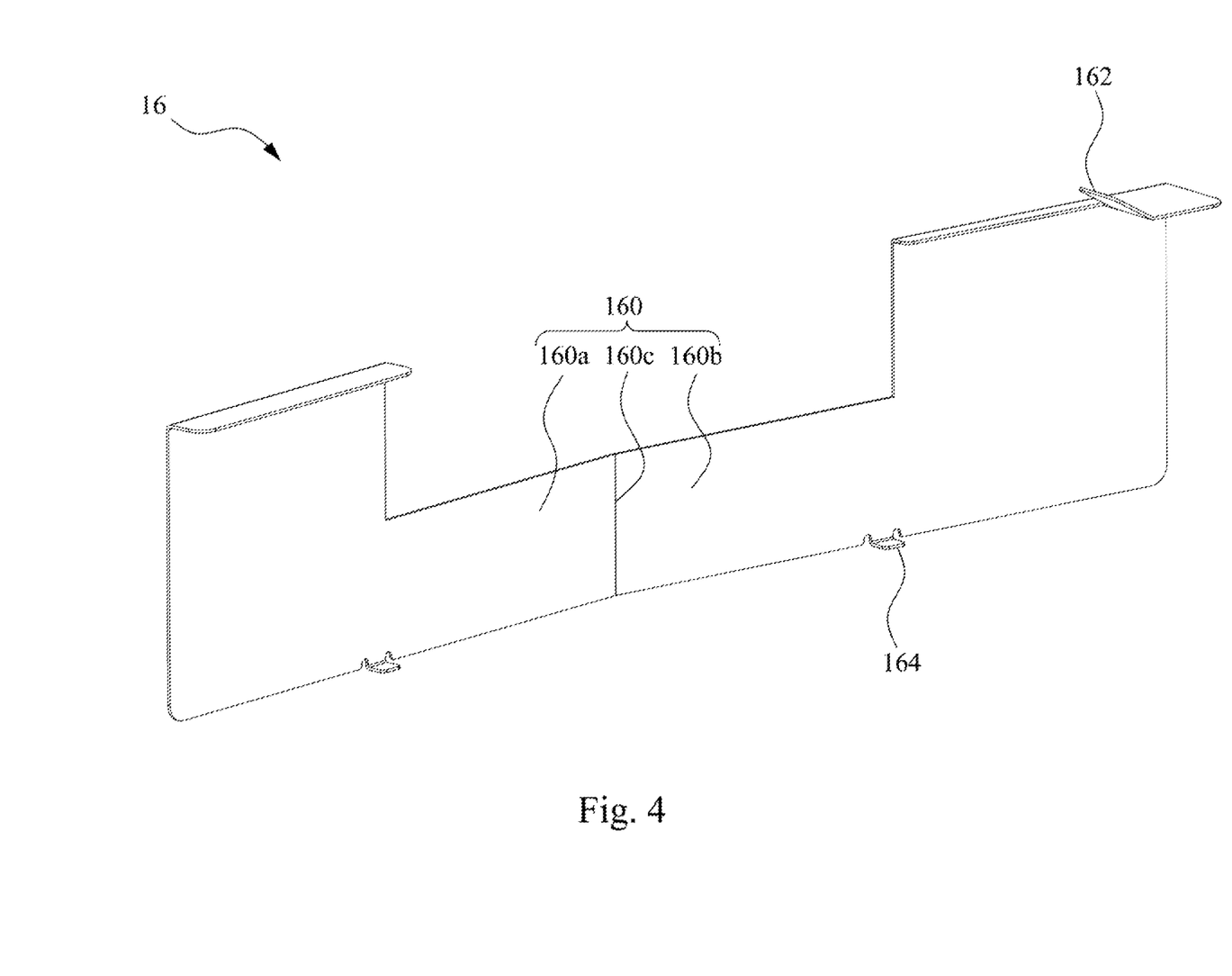
FIG. 4 is a perspective view of a pushing bracket in FIG. 1B.

FIG. 3 is a perspective view of the storage device 2 in FIG. 1B. FIG. 4 is a perspective view of the pushing bracket 180 in FIG. 1B.

As shown in FIG. 1B, FIG. 3, and FIG. 4, the engaging bracket 16 of the chassis 1 further includes a bracket body 160 and two engaging portions 164. The bracket body 160 of the engaging bracket 16 is clamped between the sidewall 20 of the storage device 2 and the partition 14, and is connected to the bent portion 162 and the engaging portion 164. The sidewall 20 of the storage device 2 has two engaging holes 200. The engaging portions 164 of the engaging bracket 16 are respectively engaged with the engaging holes 200 on the sidewall 20 of the storage device 2. Hence, while the storage device 2 is sliding relative to the base 10 along the sliding direction D, the engaging bracket 16 engaged with the storage device 2 moves together with the storage device 2.

Furthermore, the bracket body 160 of the engaging bracket 16 includes a first body portion 160a and a second body portion 160b. The first body portion 160a and the second body portion 160b of the bracket body 160 are connected to each other and bent relative to each other to form a folding line 160c. Particularly, the first body portion 160a and the second body portion 160b abut against the sidewall 20 of the storage device 2, and the folding line 160c of the bracket body 160 abuts against the partition 14. Because the first body portion 160a and the second body portion 160b of the bracket body 160 are bent relative to each other, when the bracket body 160 is clamped between the sidewall 20 of the storage device 2 and the partition 14, the first body portion 160a and the second body portion 160b are flattened relative to the folding line 160c, and the elastic force generated by the first body portion 160a and the second body portion 160b can achieve the purpose of firmly engaging the engaging portions 164 of the engaging bracket 16 with the engaging holes 200 on the sidewall 20 of the storage device 2. Compared with the conventional tray, the bracket body 160 of the embodiment occupies less space, such that the gap between the partition 14 and the storage device 2 can be reduced, and thus is advantageous to miniaturization of the chassis 1.

In the embodiment of the disclosure, the partition 14 and the engaging bracket 16 are made of metal plates, the stopping portion 140 of the partition 14 is formed by bending the edge of the partition 14, and the bent portion 162 and the engaging portion 164 of the engaging bracket 16 are formed by bending the edges of the engaging bracket 16, but the disclosure is not limited in this regard.

Figure 5A:
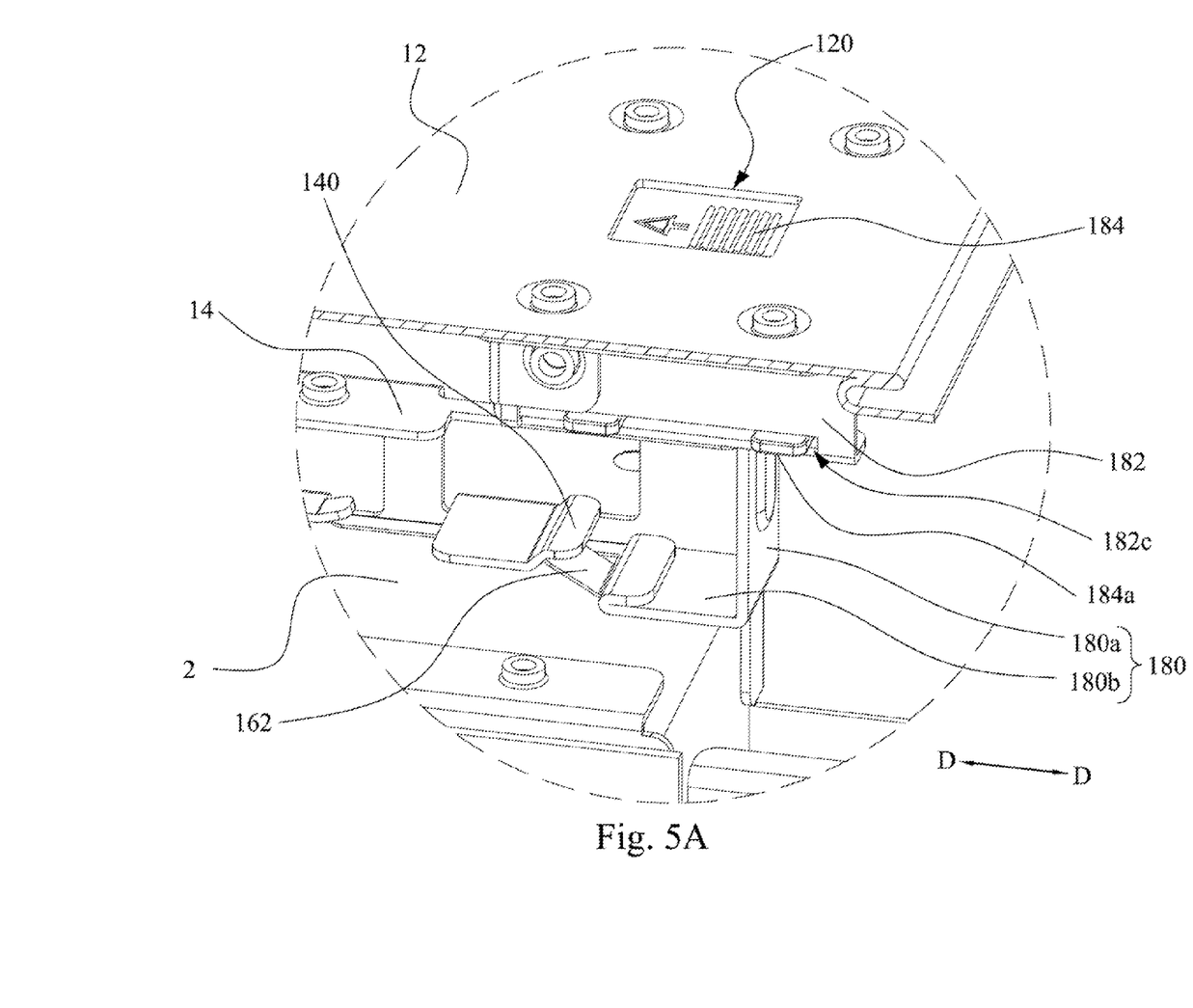
FIG. 5A is a partial cross-sectional view of FIG. 1A, in which the pushing bracket has not pushed a bent portion yet.
Figure 5B:
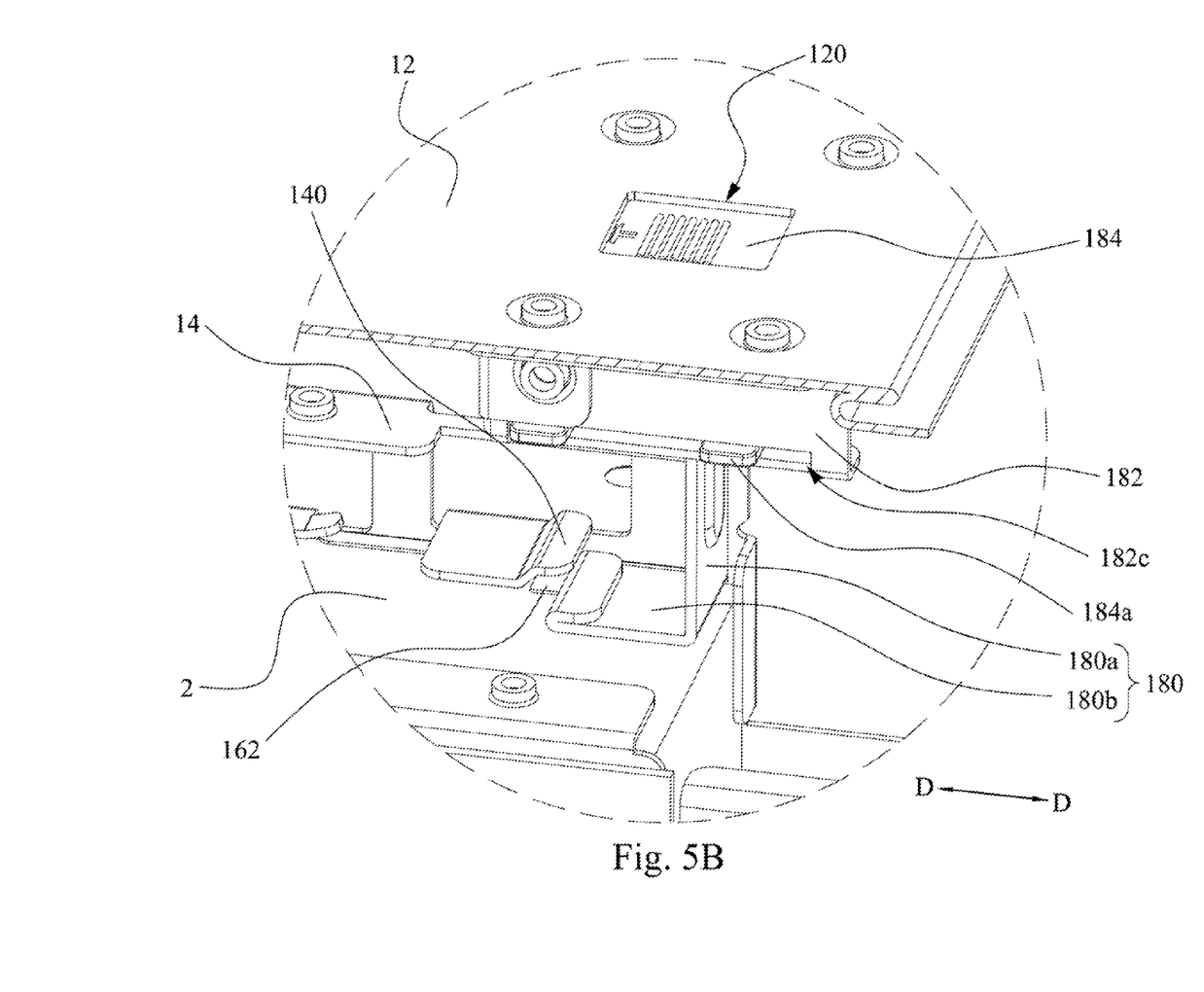
FIG. 5B is another partial cross-sectional view of FIG. 1A, in which the pushing bracket has pushed the bent portion.

FIG. 5A is a partial cross-sectional view of FIG. 1A, in which the pushing bracket 180 dose not push the bent portion 162 yet. FIG. 5B is another partial cross-sectional view of FIG. 1A, in which the pushing bracket 180 has pushed the bent portion 162.

As shown in FIG. 5A and FIG. 5B with reference to FIG. 2B, the cover 12 of the chassis 1 has a push button hole 120, and the latch 184 of the push button assembly 18 is aligned with the push button hole 120. In other words, the latch 184 of the push button assembly 18 is exposed from the push button hole 120 of the cover 12, so that the user may push the latch 184 from the exterior of the chassis 1. When the user pushes and moves the latch 184 along the sliding direction D via the push button hole 120 from the exterior of the chassis 1, the pushing bracket 180 moves together with the latch 184. After the pushing bracket 18 pushes the bent portion 162 of the engaging bracket 16 to deform the bent portion 162 toward the top surface of the storage device 2, the blocking of the stopping portion 140 of the partition 14 for the bent portion 162 can be removed. Hence, the user can easily take the storage device 2 out of the chassis 1 (by pushing or pulling) from the entrance 11.

Figure 6:
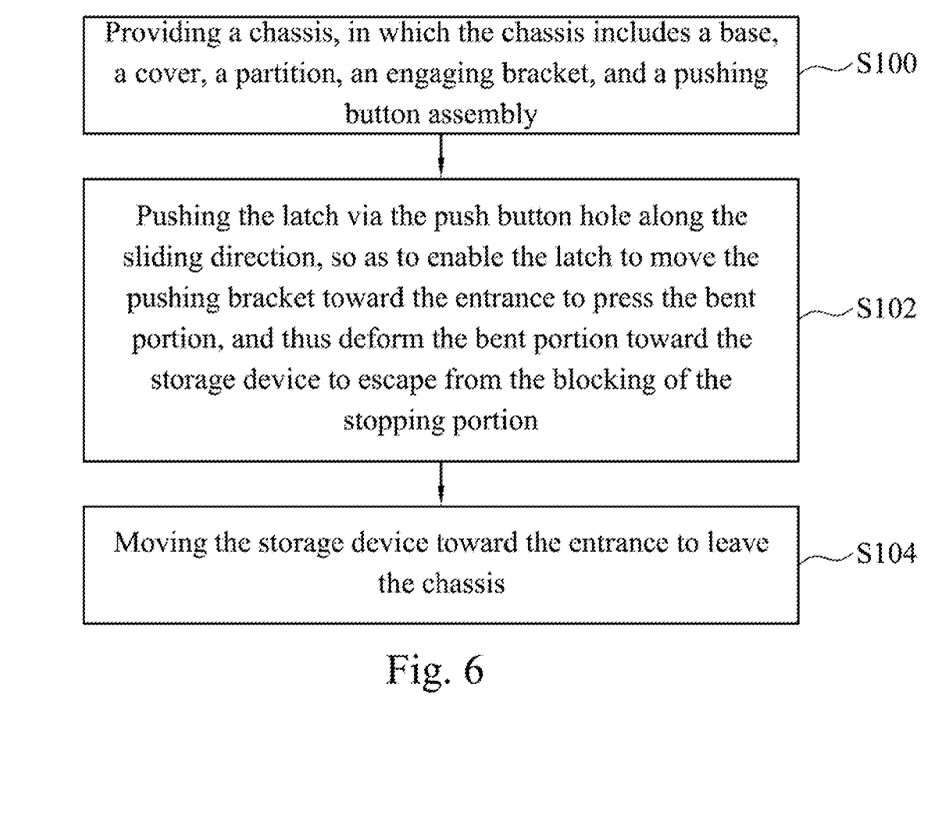
FIG. 6 is a flow chart of an operating method of a chassis according to an embodiment of the disclosure.

FIG. 6 is a flow chart of an operating method of a chassis according to an embodiment of the disclosure.

As shown in FIG. 6 with reference to FIG. 1A to FIG. 5B, the operating method of chassis includes steps S100-S104.

Step S100 is performed for providing a chassis 1, in which the chassis 1 includes a base 10, a cover 12, a partition 14, an engaging bracket 16, and a pushing button assembly 18.

In detail, the base 10 and the cover 12 are connected to form an entrance 11 and an accommodating space A. The storage device 2 is slidably disposed on the base 10 along a sliding direction D. The partition 14 is disposed on the base 10 and adjacent to a sidewall 20 of the storage device 2. The partition 14 includes a stopping portion 140. The stopping portion 140 is located over a top surface of the storage device 2. The engaging bracket 16 is fixed to the sidewall 20 and includes a bent portion 162. The bent portion 162 is located over the storage device 2, and faces toward the entrance 11, and bent upwards relative to the storage device 2. The stopping portion 140 blocks between the distal end of the bent portion 162 and the entrance 11. The push button assembly 18 is fixed on the cover 12 and includes a pushing bracket 180. The pushing bracket 180 substantially extends away from the cover 12 and is capable of sliding relative to the cover 12 along the sliding direction D. In addition, the cover 12 has a push button hole 120. The push button assembly 18 further includes a holder 182 and a latch 184. The holder 182 is fixed to the cover 12 and forms a chute 182a with the cover 12. The chute 182a is parallel to the sliding direction D. The latch 184 is slidably disposed in the chute 182a and aligned with the push button hole 120. The pushing bracket 180 is connected to the latch 184.

Step S102 is performed for pushing the latch 184 via the push button hole 120 along the sliding direction D, so as to enable the latch 184 to move the pushing bracket 180 toward the entrance 11 to press the bent portion 162, and thus deform the bent portion 162 toward the storage device 2 to escape from the blocking of the stopping portion 140.

Step S104 is performed for moving the storage device 2 toward the entrance 11 to leave the chassis 1.

According to the foregoing recitations of the embodiments of the disclosure, it can be seen that the chassis of the disclosure collocate the partition with the engaging bracket engaged to the sidewall of the storage device to replace the conventional tray supporting the storage device, thereby effectively increasing the internal space of the chassis. In addition, the push button assembly of the disclosure is disposed on the cover of the chassis, and the latch of the push button assembly is exposed from the push button hole of the cover, so that a user may push the latch from the exterior of the chassis to enable the pushing bracket to push the bent portion of the engaging bracket, and thus removes the blocking of the stopping portion applied to the bent portion. Therefore, the user may easily remove the storage device from the chassis. The push button assembly of the disclosure is easy to be operated, and has a simple structure, and thus is cheap and affordable.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A push button assembly disposed on a cover, the cover having a push button hole, the push button assembly comprising:
    a holder fixed to the cover and forming a chute with the cover, the holder having an abutting plate and a retaining structure, the chute having a first end and a second end, wherein the abutting plate is located at the first end, and the retaining structure is located in the chute, the chute is parallel to a sliding direction, and the holder further has a passing hole;
    a latch slidably disposed in the chute and aligned with the push button hole, wherein the retaining structure blocks the latch, so as to prevent the latch from leaving the chute from the second end;
    a resilient member disposed in the chute and compressed between the abutting plate and the latch;
    a pushing bracket connected to the latch and substantially extending away from the cover wherein the pushing bracket comprises:
        a passing portion connected to the latch and passing through the passing hole; and
        a pushing portion connected to the passing portion and substantially parallel to the sliding direction;
    wherein the retaining structure is a slotted hole extending along the sliding direction, the latch has a resilient arm and a distal end of the resilient arm is slidably engaged with the slotted hole; and
    wherein the resilient member is a spring, the abutting plate has a through hole, and the latching further has a column which extends towards the first end and passes through the through hole, and the spring sleeved onto the column.

2. A chassis for accommodating a storage device, the chassis comprising:
    a base, wherein the storage device is slidably disposed on the base along a sliding direction;
    a cover connected to the base to form an entrance and an accommodating space;
    a partition disposed on the base and adjacent to a sidewall of the storage device, wherein the partition comprises a stopping portion located over a top surface of the storage device;
    an engaging bracket fixed to the sidewall and comprising a bent portion which is located over the storage device, faces toward the entrance, and bent upwards relative to the storage device, wherein the stopping portion blocks between a distal end of the bent portion and the entrance; and
    a push button assembly fixed on the cover and comprising a pushing bracket which substantially extends away from the cover and is capable of sliding relative to the cover along the sliding direction, wherein when the pushing bracket slides toward the entrance to push the bent portion, the bent portion is deformed toward the storage device to escape from the blocking of the stopping portion.

3. The chassis of claim 2, wherein the push button assembly further comprises:
    a holder fixed to the cover and forming a chute with the cover, wherein the chute is parallel to the sliding direction, the holder having an abutting plate and a retaining structure, the chute having a first end and a second end, and the abutting plate is located at the first end, and the retaining structure is located in the chute;
    a latch slidably disposed in the chute, wherein the retaining structure blocks the latch, and the pushing bracket is connected to the latch; and
    a resilient member disposed in the chute and compressed between the abutting plate and the latch.

4. The chassis of claim 3, wherein the retaining structure is a slotted hole extending along the sliding direction, and the latch has a resilient arm, and a distal end of the resilient arm is slidably engaged with the slotted hole.

5. The chassis of claim 4, wherein the resilient member is a spring, the abutting plate has a through hole, the latch further has a column which extends toward the first end and passes through the through hole, and the spring is sleeved onto the column.

6. The chassis of claim 5, wherein the holder further has a passing hole, the pushing bracket comprises:
    a passing portion connected to the latch and passing through the passing hole; and
    a pushing portion connected to the passing portion and substantially parallel to the sliding direction, wherein a distal end of the pushing portion faces toward the bent portion.

7. The chassis of claim 6, wherein the cover has a push button hole, and the latch is aligned with the push button hole.

8. The chassis of claim 7, wherein the engaging bracket further comprises at least one engaging portion engaged with an engaging hole on the sidewall of the storage device.

9. The chassis of claim 8, wherein the engaging bracket further comprises a bracket body which is clamped between the sidewall and the partition and connected to the bent portion and the engaging portion.

10. The chassis of claim 9, wherein the bracket body comprises a first body portion and a second body portion which are connected to each other and bent relative to each other to form a folding line, and the folding line abuts against the partition.

11. An operating method of a chassis for dismantling a storage device, the operating method comprising:
(a) providing a chassis, wherein the chassis comprises a base, a cover, a partition, an engaging bracket, and a pushing button assembly, the base and the cover are connected to form an entrance and an accommodating space, the storage device is slidably disposed on the base along a sliding direction, the partition is disposed on the base and adjacent to a sidewall of the storage device, the partition comprises a stopping portion located over a top surface of the storage device, the engaging bracket is fixed to the sidewall and comprises a bent portion which is located over the storage device, faces toward the entrance, and bent upwards relative to the storage device, the stopping portion blocks between a distal end of the bent portion and the entrance, and the push button assembly is fixed on the cover and comprises a pushing bracket which substantially extends away from the cover and is capable of sliding relative to the cover along the sliding direction;
(b) moving the pushing bracket toward the entrance along the sliding direction to push the bent portion, so as to deform the bent portion toward the storage device to escape from the blocking of the stopping portion; and
(c) moving the storage device toward the entrance to leave the chassis.

12. The operating method of chassis of claim 11, wherein the cover has a push button hole, the push button assembly further comprises a holder and a latch, the holder is fixed to the cover and forms a chute with the cover, the chute is parallel to the sliding direction, the latch is slidably disposed in the chute and aligned with the push button hole, the pushing bracket is connected to the latch, and the step (b) comprises:
(b1) pushing the latch via the push button hole along the sliding direction, so as to enable the latch to move the pushing bracket toward the entrance.

* * * * *